United States Patent
Zhang et al.

(10) Patent No.: US 12,532,450 B2
(45) Date of Patent: Jan. 20, 2026

(54) METHOD OF FORMING A 4F2 DRAM INCLUDING BURIED BITLINE

(71) Applicant: Applied Materials, Inc., Santa Clara, CA (US)

(72) Inventors: Qintao Zhang, Mt Kisco, NY (US); Sipeng Gu, Clifton Park, NY (US)

(73) Assignee: Applied Materials, Inc., Santa Clara, CA (US)

( * ) Notice: Subject to any disclaimer, the term of this patent is extended or adjusted under 35 U.S.C. 154(b) by 478 days.

(21) Appl. No.: 18/164,082

(22) Filed: Feb. 3, 2023

(65) Prior Publication Data

US 2024/0268095 A1  Aug. 8, 2024

(51) Int. Cl.
*H10B 12/00* (2023.01)
*H10D 30/01* (2025.01)
*H10D 30/63* (2025.01)

(52) U.S. Cl.
CPC .......... *H10B 12/053* (2023.02); *H10B 12/34* (2023.02); *H10B 12/482* (2023.02); *H10D 30/025* (2025.01); *H10D 30/63* (2025.01)

(58) Field of Classification Search
CPC .... H10B 12/053; H10B 12/34; H10B 12/482; H10D 30/025; H10D 30/63
See application file for complete search history.

(56) References Cited

U.S. PATENT DOCUMENTS

2022/0165738 A1* 5/2022 Zhang ............... H10D 30/6728

OTHER PUBLICATIONS

Chung et al., "Novel 4F2 Dram Cell with Vertical Pillar Transistor(VPT)", 78-1-4577-0708-7/11, pp. 211-214.
Schloesser et al, "A 6F2 Buried Wordline DRAM Cell for 40nm and Beyond," 4 pages.

* cited by examiner

*Primary Examiner* — Hoai V Pham
(74) *Attorney, Agent, or Firm* — KDW Firm PLLC

(57) ABSTRACT

Disclosed are approaches for forming 4F$^2$ vertical DRAM devices including buried bitlines. One DRAM device may include a plurality of bitlines between a plurality of vertical structures extending from a substrate, and a bottom source/drain formed in each of the plurality of vertical structures in a saddle area, wherein the saddle area comprises a saddle trench formed through the plurality of vertical structures. The DRAM device may further include a dielectric film formed over the plurality of vertical structures in the saddle area, wherein the dielectric film is present along a portion of the plurality of bitlines and along just a first sidewall the plurality of vertical structures in the saddle area, and a fill material over the plurality of vertical structures of the saddle area, wherein the fill material directly contacts the plurality of bitlines.

9 Claims, 10 Drawing Sheets

METHOD OF FORMING A 4F2 DRAM INCLUDING BURIED BITLINE

FIELD OF THE DISCLOSURE

The present disclosure relates to semiconductor structures and, more particularly, to 4F2 DRAM devices including a buried bitline.

BACKGROUND OF THE DISCLOSURE

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices suffer from high bitline resistance.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a 4F2 vertical dynamic random-access memory transistor may include a plurality of bitlines between a plurality of vertical structures extending from a substrate, and a saddle area through the plurality of vertical structures and through the plurality of bitlines, wherein the saddle area comprises an oxide formed within a saddle trench. The 4F2 vertical dynamic random-access memory transistor may further include a dielectric film formed over the plurality of vertical structures in the saddle area, wherein the dielectric film is present along a portion of the plurality of bitlines and along just a first sidewall the plurality of vertical structures in the saddle area, and a fill material over the plurality of vertical structures of the saddle area, wherein the fill material directly contacts the plurality of bitlines.

In yet another aspect, a dynamic random-access memory device may include a plurality of bitlines between a plurality of vertical structures extending from a substrate and a bottom source/drain formed in each of the plurality of vertical structures in a saddle area, wherein the saddle area comprises a saddle trench formed through the plurality of vertical structures. The DRAM device may further include a dielectric film formed over the plurality of vertical structures in the saddle area, wherein the dielectric film is present along a portion of the plurality of bitlines and along just a first sidewall the plurality of vertical structures in the saddle area. The DRAM device may further include a fill material over the plurality of vertical structures of the saddle area, wherein the fill material directly contacts the plurality of bitlines.

In yet another aspect, a method of forming a dynamic random-access memory device may include forming a plurality of bitlines between a plurality of vertical structures extending from a substrate, and forming a saddle area through the plurality of vertical structures and through the plurality of bitlines, wherein the saddle area comprises an oxide formed within a saddle trench. The method may further include forming a dielectric film over each of the plurality of vertical structures of the saddle area, and implanting, through the dielectric film, the plurality of vertical structures of the saddle area to form a bottom source/drain in each of the plurality of vertical structures of the saddle area. The method may further include removing the dielectric film by performing an angled ion etch oriented at a non-zero angle relative to a perpendicular extending from an upper surface of the plurality of vertical structures, wherein ions of the angled ion etch are directed into a first side and the upper surface of the plurality of vertical structures of the saddle area without being directed into a second side of the plurality of vertical structures of the saddle area.

BRIEF DESCRIPTION OF THE DRAWINGS

The accompanying drawings illustrate exemplary approaches of the disclosure, including the practical application of the principles thereof, as follows.

Figure 1A:
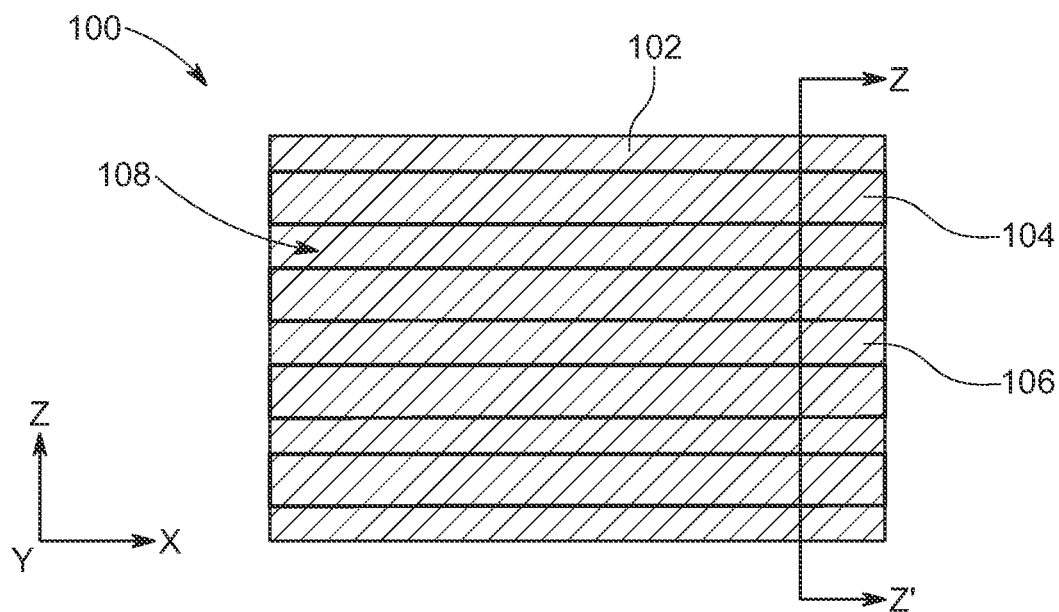
FIG. 1A illustrates a top view of a device at one stage of processing, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, disclosed herein are DRAM devices including buried metal bitlines formed using an implantation process followed by an angled etch process to remove just a portion of a dielectric film formed over a finned substrate. Subsequent formation of a metal fill material connects the buried metal bitlines with N+ bottom source/drains formed in each fin. At least the following advantages are realized by embodiments of the present disclosure. Firstly, buried metal bitlines significantly reduce bitline resistance. Secondly, every two pillars are connected to a buried metal bitline. Thirdly, one or more merged metal gates are formed perpendicular to the buried metal bitlines and serve as wordlines. Fourthly, the bitline/wordline are aligned with pillar direction and connected on different levels vertically, thus enabling high speed 4F2 DRAM.

Figure 1B:
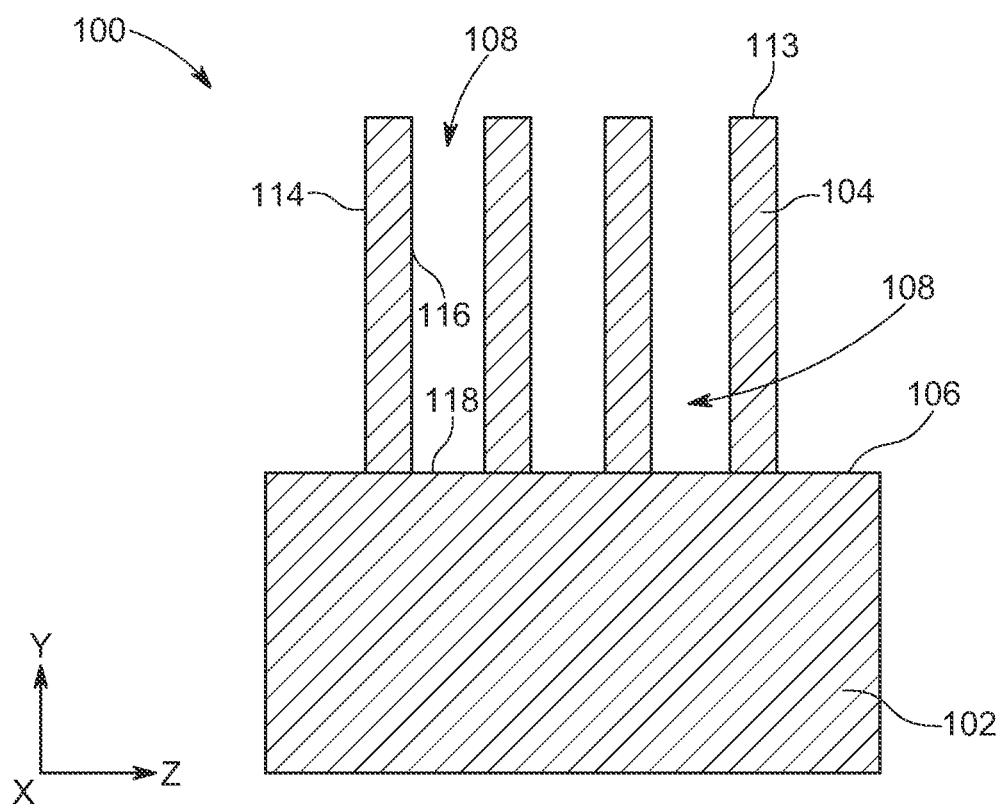
FIG. 1B illustrates a cross-sectional side view of the device of FIG. 1A along cutline Z-Z', according to embodiments of the present disclosure.

FIG. 1A is a top view and FIG. 1B is a side cross-sectional view (along cutline Z-Z') of a portion of a semiconductor device (hereinafter "device") 100, such as a DRAM device, at one stage of processing, according to embodiments of the present disclosure. As shown, the device 100 may include a base or substrate 102, and a plurality of vertical structures 104 (e.g., fins) extending from an upper surface 106 of the substrate 102. The vertical structures 104 may extend perpendicular to one another, and may define an upper surface 113 and a plurality of trenches 108. Although non-limiting, the substrate 102 and the vertical structures 104 may be silicon.

The plurality of trenches 108 may be formed in the substrate 102 using, e.g., one or more blocking and vertical etch processes to create sidewall slope from 80 to 90 degrees. The trenches 108 may be defined, in part, by a first sidewall 114 and a second sidewall 116 of each vertical structure 104, and a bottom surface 118 extending between two adjacent vertical structures 104. In the illustrated embodiment, the substrate 102 may include a semiconductor material, such as a silicon (Si) semiconductor wafer. In some embodiments, the vertical structures 104 and the base of the substrate 102 may comprise the same material, such as a semiconductor material. In other embodiments, the vertical structures 104 and the base may comprise different materials.

Figure 2A:
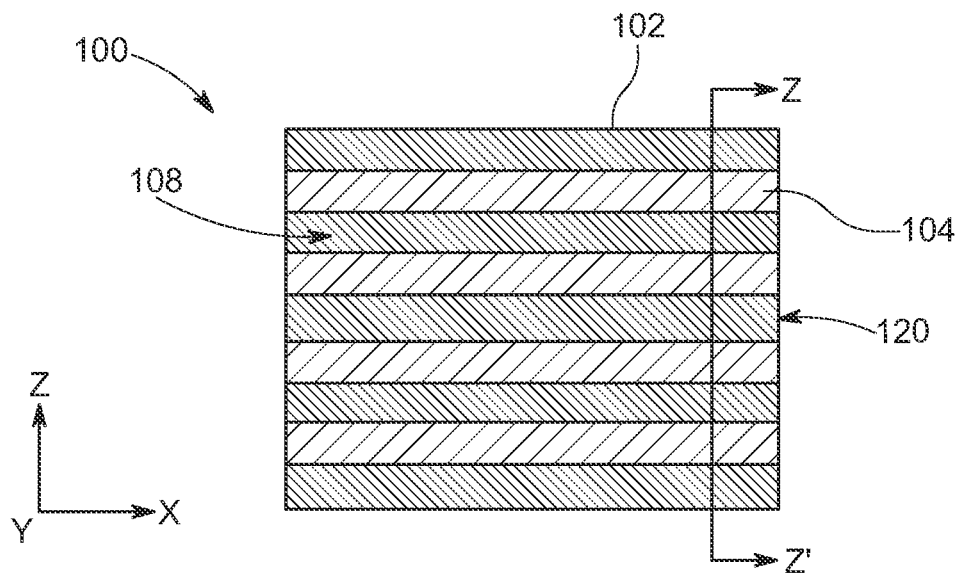
FIG. 2A illustrates a top view of the device following formation of a plurality of bitlines, according to embodiments of the present disclosure.
Figure 2B:
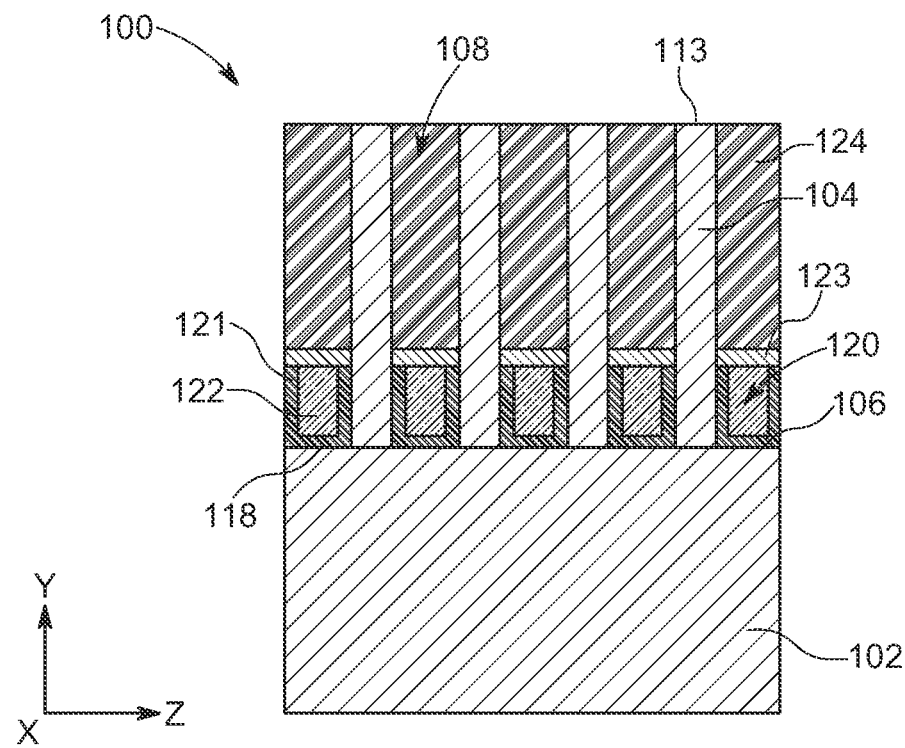
FIG. 2B illustrates a cross-sectional side view of the device of FIG. 2A along cutline Z-Z', according to embodiments of the present disclosure.

FIG. 2A is a top view and FIG. 2B is a side cross-sectional view (along cutline Z-Z') of the device 100 following formation of a plurality of bitlines 120 within the trenches 108. In some embodiments, the bitlines 120 may include a liner 121 (e.g., nitride or titanium nitride) and a metal 122 (e.g., tungsten) formed atop the bottom surface 118 of each trench 108. As further shown, a capping layer 123 (e.g., nitride) may also be formed over the liner 121 and the metal 122 of the bitline 120, followed by deposition of a shallow-trench-isolation (STI) 124. As shown, the STI 124 may be formed directly atop the capping layer 123, and may extend to the upper surface 113 of the vertical structures 104. Although not shown, a sacrificial liner may be present along each of the vertical structures 104.

The material of STI 124 may be an insulative material, such as silicon oxide, a nitride, or a combination thereof. The insulative material may be formed by a high density plasma chemical vapor deposition (HDP-CVD), a flowable CVD (FCVD) (e.g., a CVD-based material deposition in a remote plasma system and post curing to convert to another material, such as an oxide), the like, or a combination thereof. Other insulation materials formed by any acceptable process may be used.

Figure 3A:
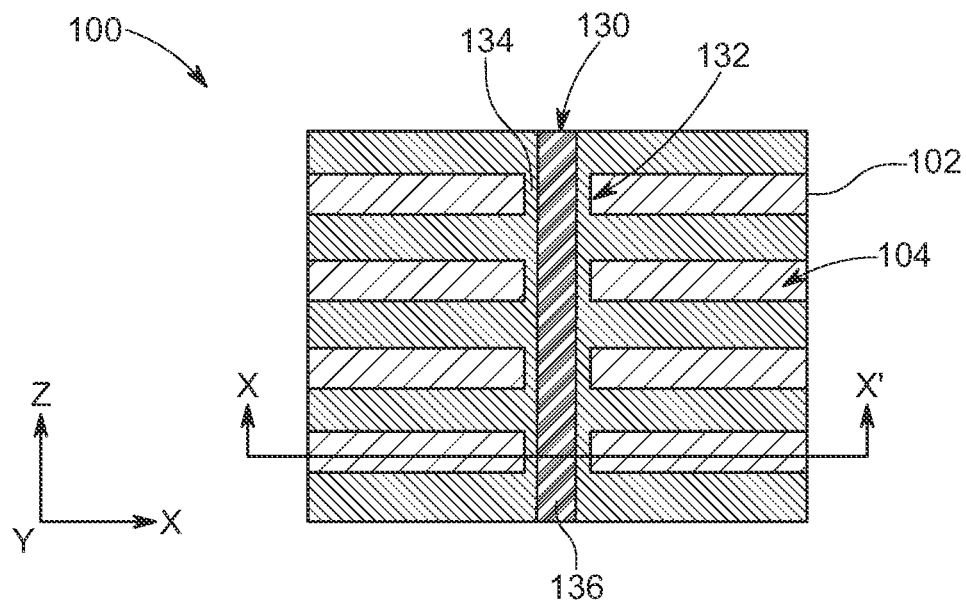
FIG. 3A illustrates a top view of the device following formation of a saddle area, according to embodiments of the present disclosure.
Figure 3B:
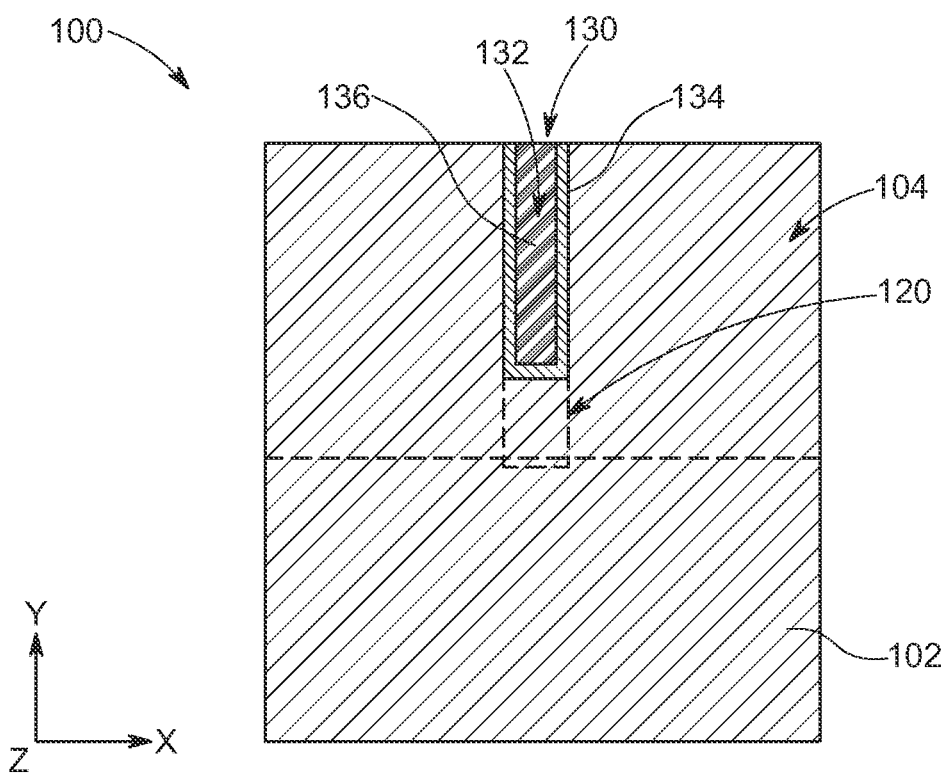
FIG. 3B illustrates a cross-sectional side view of the device of FIG. 3A along cutline X-X', according to embodiments of the present disclosure.

FIGS. 3A-3B illustrate the device 100 following forming of a saddle area 130 through the vertical structures 104 and trenches 108. In some embodiments, the saddle area 130 may include a saddle trench 132, which is etched through the vertical structures 104 in a direction (e.g., z-direction) perpendicular to a main direction (e.g., x-direction) of the vertical structures 104. The saddle area 130 may include a SiN liner 134 formed within the saddle trench 132, and an oxide (e.g., SiO2) 136 formed over the SiN liner 134.

Figure 4A:
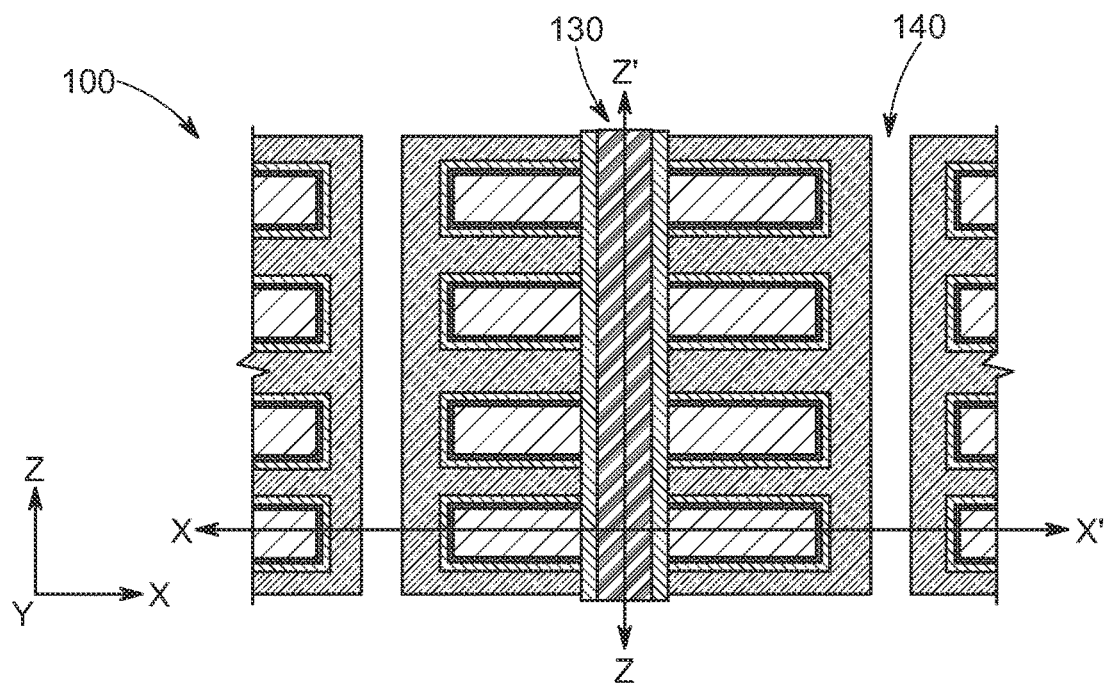
FIG. 4A illustrates a top view of the device following a pillar cut and fill process, according to embodiments of the present disclosure.
Figure 4B:
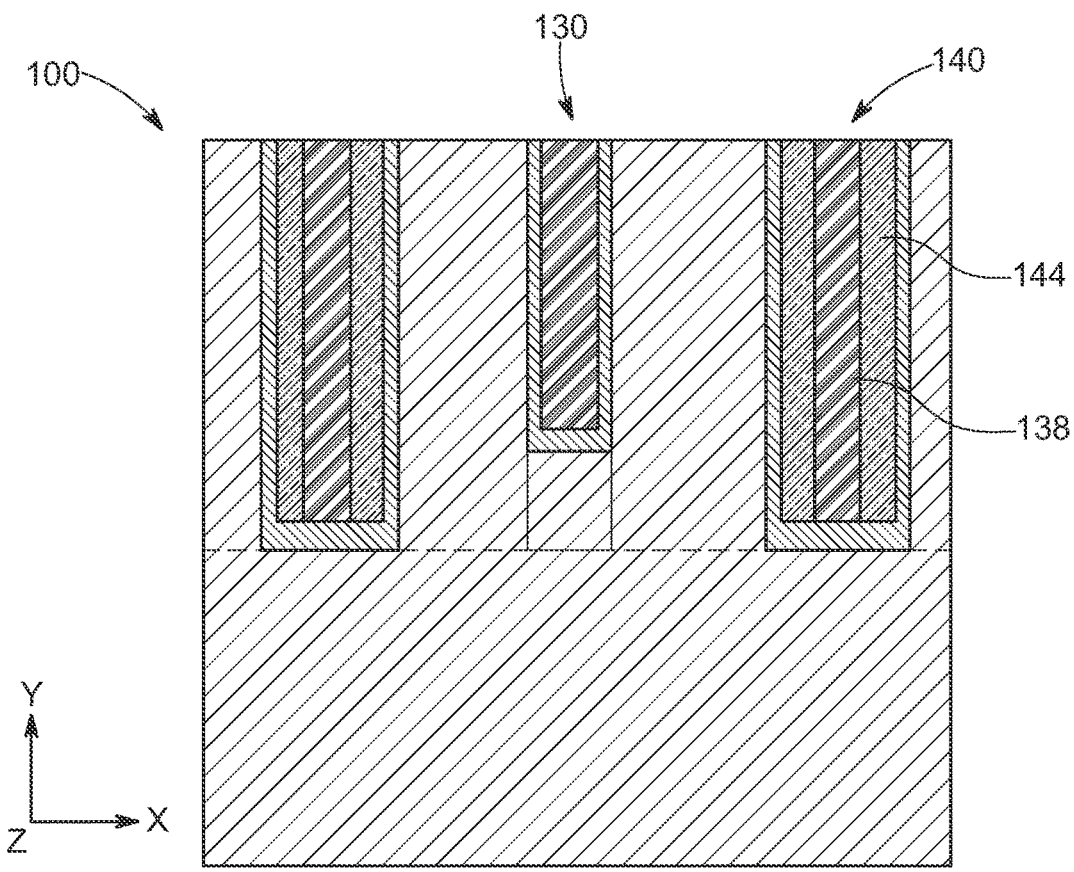
FIG. 4B illustrates a cross-sectional side view of the device of FIG. 4A along cutline X-X', according to embodiments of the present disclosure.
Figure 4C:
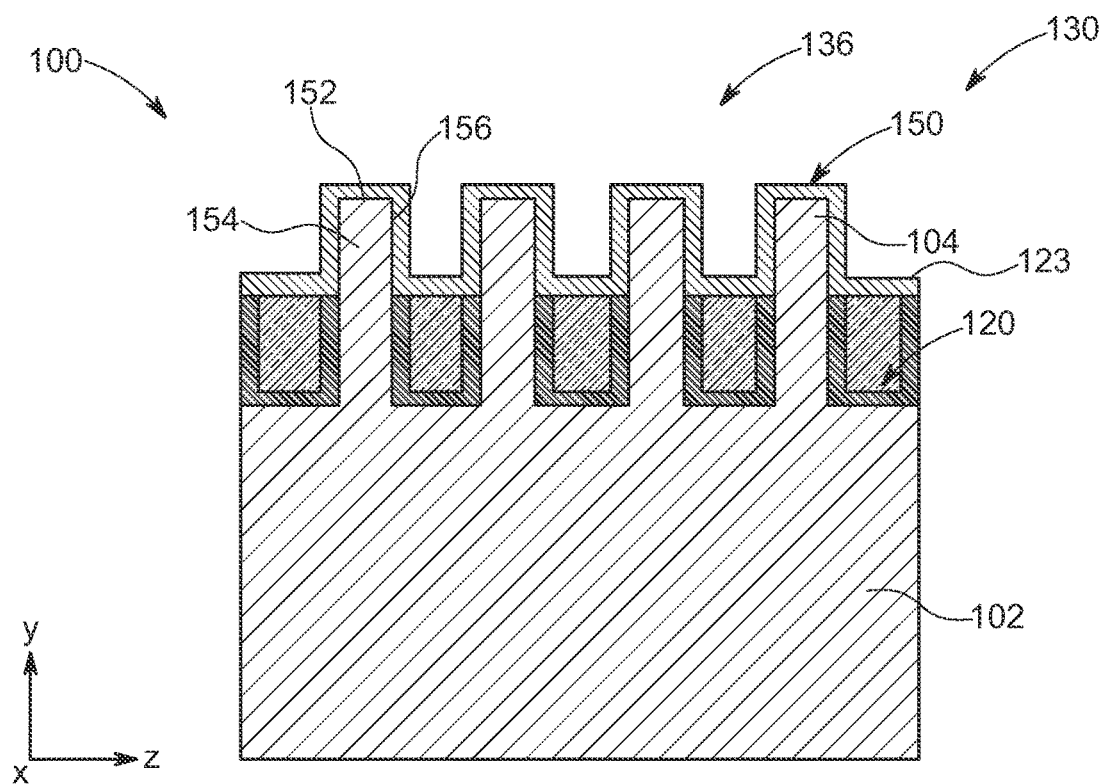
FIG. 4C illustrates a cross-sectional side view of the device of FIG. 4A along cutline Z-Z', according to embodiments of the present disclosure.

FIGS. 4A-4C demonstrate the device 100 following a pillar cut process to form a plurality of pillar trenches 140 through the vertical structures 104. As shown, the pillar trenches 140 extend primarily in a second direction (e.g., z-direction), which is perpendicular to the first direction (e.g., x-direction) of the vertical structures 104. In some embodiments, the pillar trenches 140 may be filled with a gate oxide 144 and metal 138 to form a set of merged metal gates. Following the pillar cut process, a plurality of pillars may be formed from the vertical structures 104, wherein every two pillars are connected to a same buried metal bitline 120.

As best shown in FIG. 4C, each of the vertical structures 104 in the saddle area 130 may include a dielectric film 150 formed over an upper surface 152, a first sidewall 154, and a second sidewall 156 thereof. The dielectric film 150 may further connect with the capping layer 123 formed over the bitlines 120. The oxide 136 of the saddle area 130 may be present over the dielectric film 150. In some embodiments, the dielectric film 150 may include multiple film layers. Embodiments herein are not limited in this context.

Figure 5:
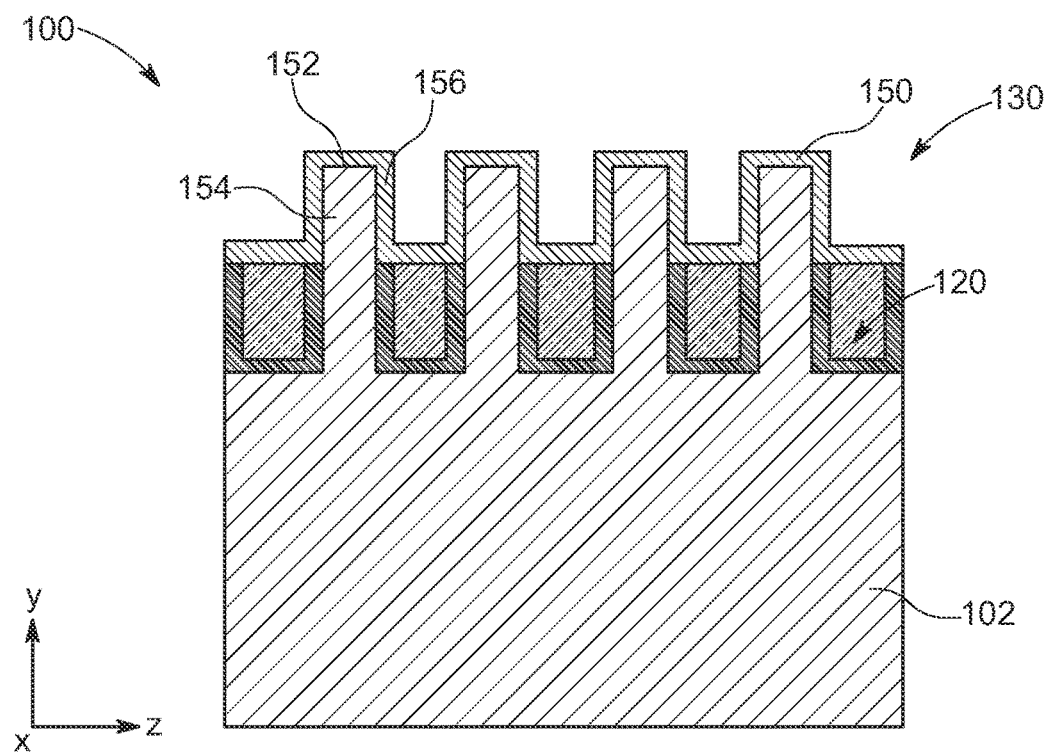
FIG. 5 illustrates cross-sectional side view of the device following formation of a dielectric film, according to embodiments of the present disclosure.
Figure 6:
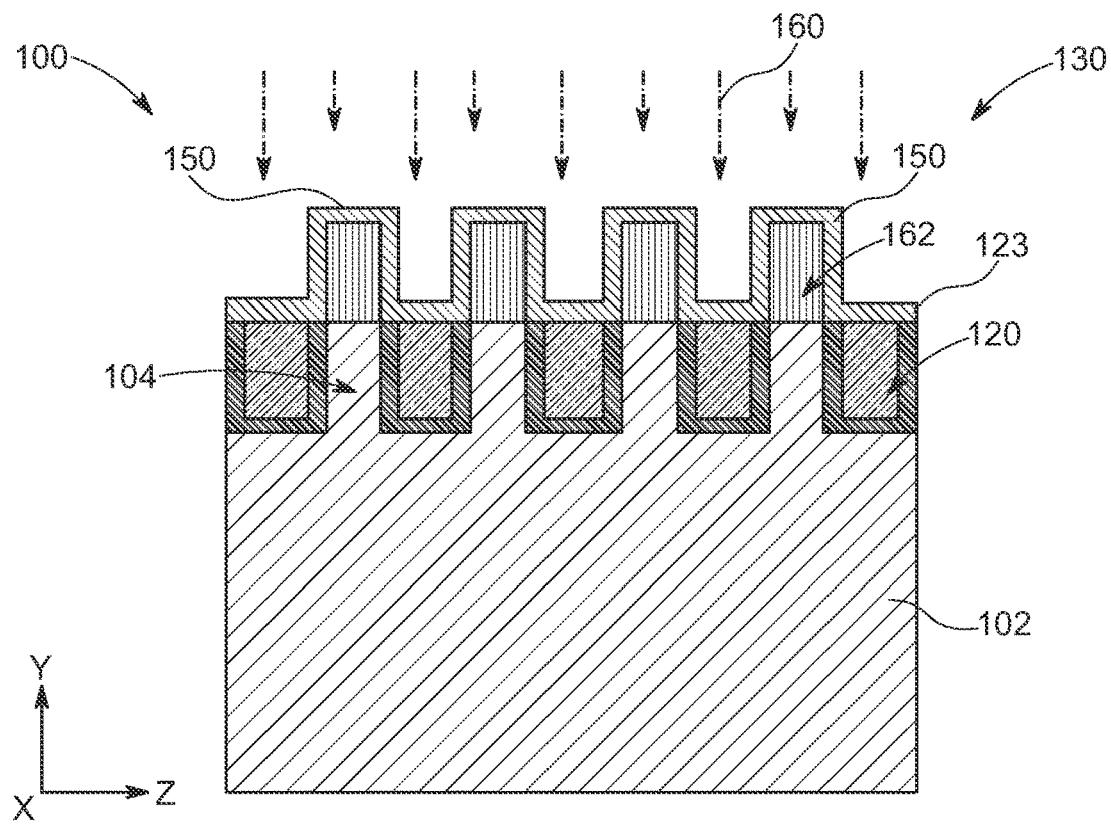
FIG. 6 illustrates cross-sectional side view of the device during an implantation process, according to embodiments of the present disclosure.

The oxide 136 may then be removed, as shown in FIG. 5, and an ion implant may then be performed, as demonstrated in FIG. 6. In some embodiments, ions 160 of the implant may be delivered vertically through the dielectric film 150 to form a bottom source/drain 162 in each of the plurality of vertical structures 104 of the saddle area 130. Although non-limiting, P+, As+, and/or Sb+ ions may be directed into the dielectric film 150 at a desired energy to form N+ bottom source/drain 162 to a depth approximately equal to an upper surface 168 of the metal 122 of the bitlines 120. Although not shown, the device 100 may then be annealed to drive in the ions 160 and to form a bottom source/drain junction adjacent the N+ bottom source/drain 162.

Figure 7A:
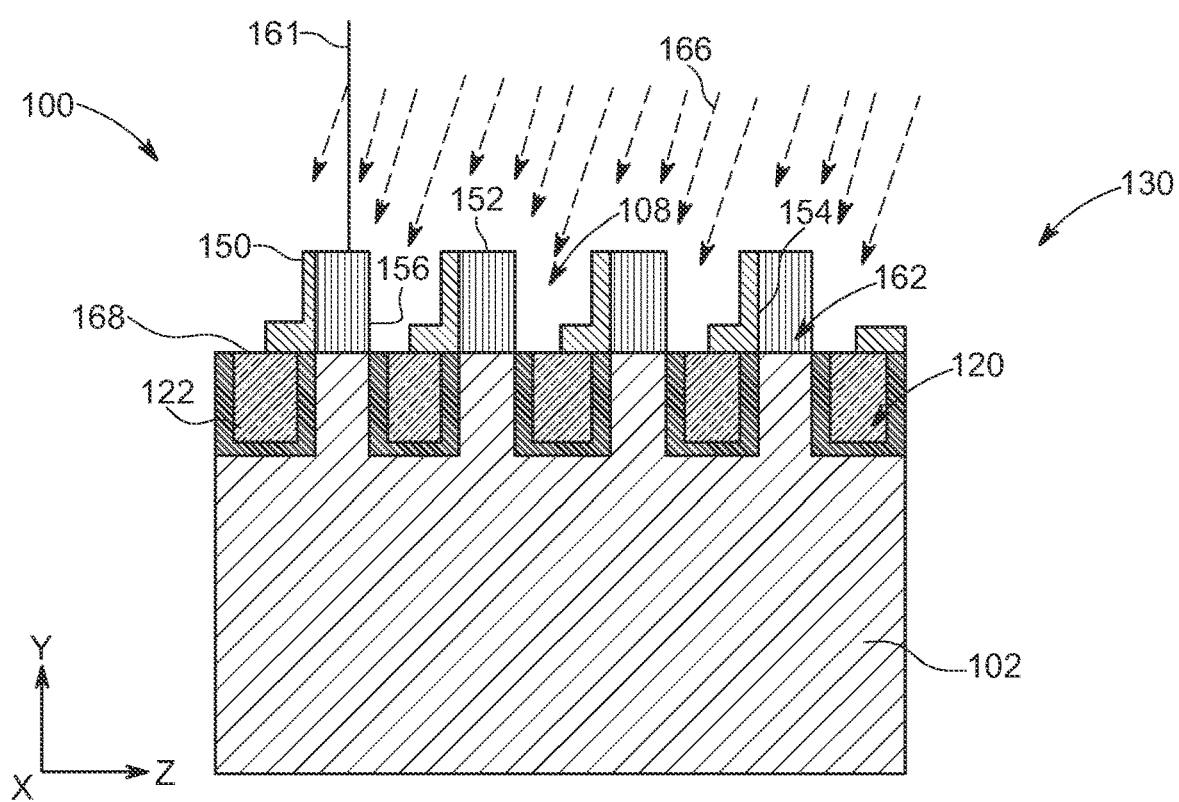
FIG. 7A illustrates cross-sectional side view of the device during an angled etch process, according to embodiments of the present disclosure.

In FIG. 7A, the dielectric film 150 may be partially removed from the device 100 using, e.g., an etch process 166. More specifically, one or more angled ion etch cycles may be performed in which ions are delivered to the device 100 at a non-zero angle relative to a perpendicular 161 extending from the upper surface 152 of the vertical structures 104 of the saddle area 130. As shown, the dielectric film 150 may be removed from the upper surface 152 and the second sidewall 156 of the N+ bottom source/drain 162 in the saddle area 130. However, the dielectric film 150 remains along the first sidewall 154, and along a portion of the upper surface 168 of the metal 122 of the bitlines 120. As a result, the metal 122 of the bitlines 120 is exposed within the trenches 108. By selecting an appropriate angle of ion delivery, the etch process 166 may not impact the first sidewall 154.

Figure 7B:
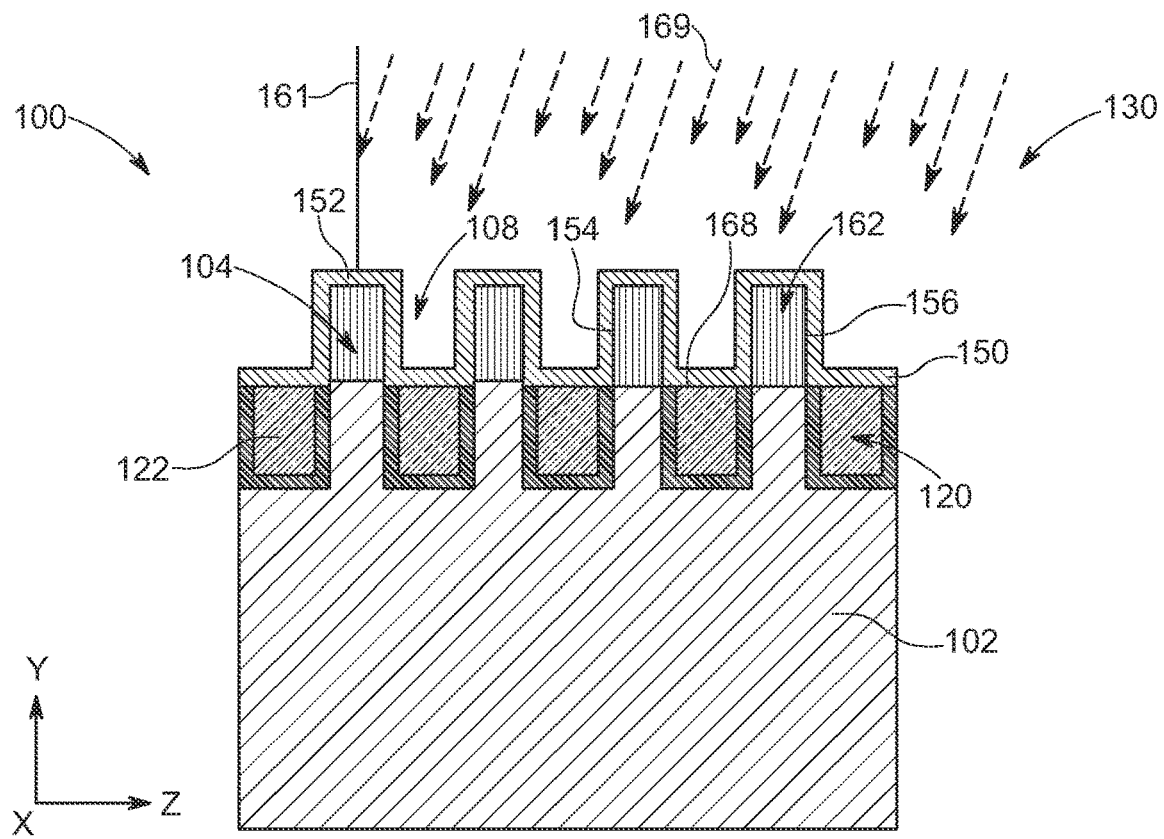
FIGS. 7B-7C illustrate cross-sectional side views of the device during angled implant and etch processes, according to embodiments of the present disclosure.

FIG. 7B demonstrates an alternative approach for partially removing the dielectric film 150 according to an embodiment of the disclosure. As shown, one or more angled ion implant cycles may be performed in which ions 169 are delivered to the device 100 at a non-zero angle relative to the perpendicular 161 to modify an etch rate of certain portions of the dielectric film 150. For example, the dielectric film 150 may be implanted along the upper surface 152 and the second sidewall 156 of the N+ bottom source/drain 162 in the saddle area 130. However, the dielectric film 150 is generally not impacted along the first sidewall 154 or along a portion of the upper surface 168 of the metal 122 of the bitlines 120. By selecting an appropriate angle of ion delivery for ions 169, the implant process may not impact the first sidewall 154. In some embodiments, the ions 169 are delivered as part of a precision materials engineering (PME) process.

Figure 7C:
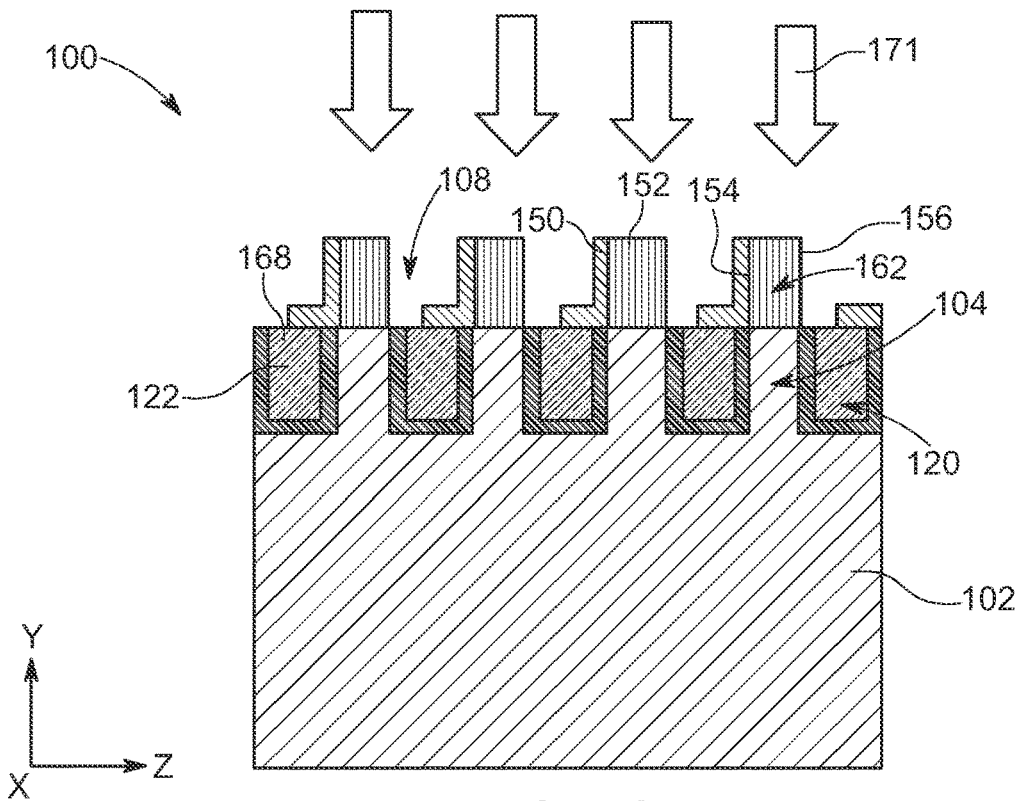

Next, as shown in FIG. 7C, an etch process 171 may be performed following the angled ion implant to partially remove the dielectric film 150 from the device 100. In various embodiments, the etch process 171 may be a wet etch (e.g., HDF) or a dry etch (e.g., isotropic dry etch) operable to remove the dielectric film 150 from the upper surface 152 and the second sidewall 156 of the N+ bottom source/drain 162 in the saddle area 130. However, the dielectric film 150 remains along the first sidewall 154, and along the portion of the upper surface 168 of the metal 122 of the bitlines 120. The ion implant demonstrated in FIG. 7B modifies properties of the dielectric film 150 to increase the etch rate thereof, as desired.

Figure 8:
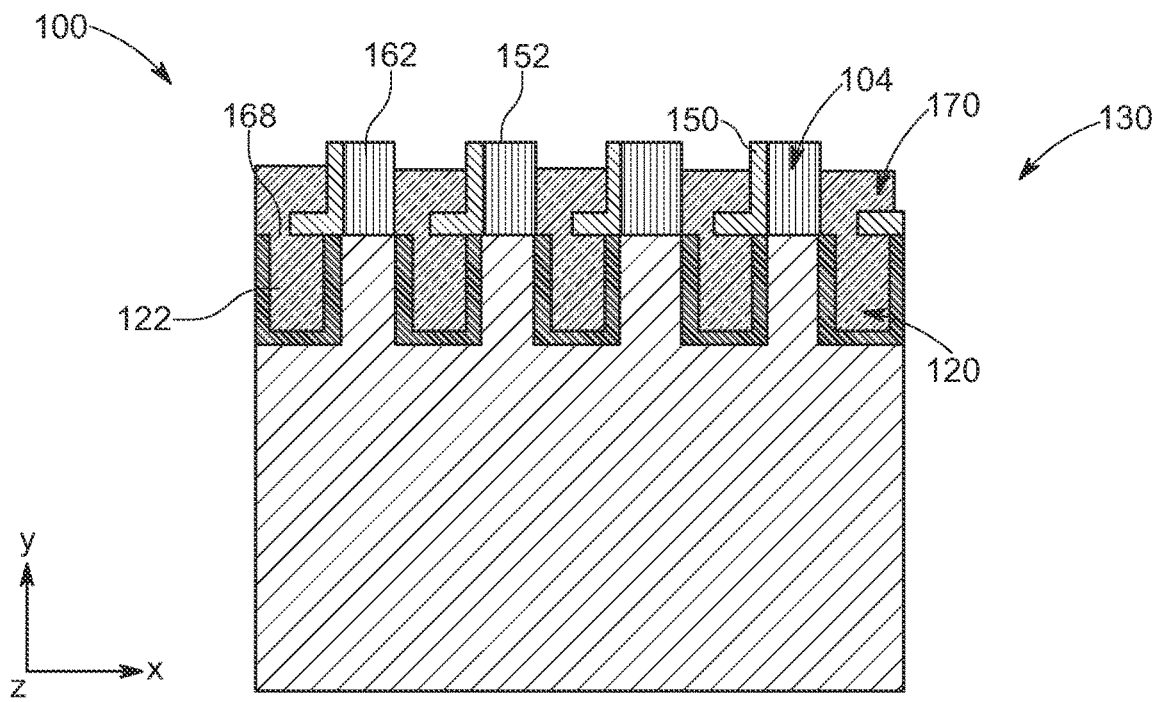
FIG. 8 illustrates cross-sectional side view of the device following a fill process, according to embodiments of the present disclosure.

In FIG. 8, a fill material 170 may then be formed over the vertical structures 104 and over the dielectric film 150 in the saddle area 130. In some embodiments, the fill material 170 may be a metal (e.g., tungsten) or an in-situ doped polysilicon, which contacts the upper surface 168 of the metal 122 of the bitlines 120. The fill material 170 may be deposited and then etched back to the position/height shown. Although non-limiting, the fill material 170 may be recessed to a height below the upper surface 152 of the vertical structures 104 of the saddle area 130. Advantageously, the fill material 170 provides a connection between the N+ bottom source/drain 162 and the buried bitlines 120.

Figure 9A:
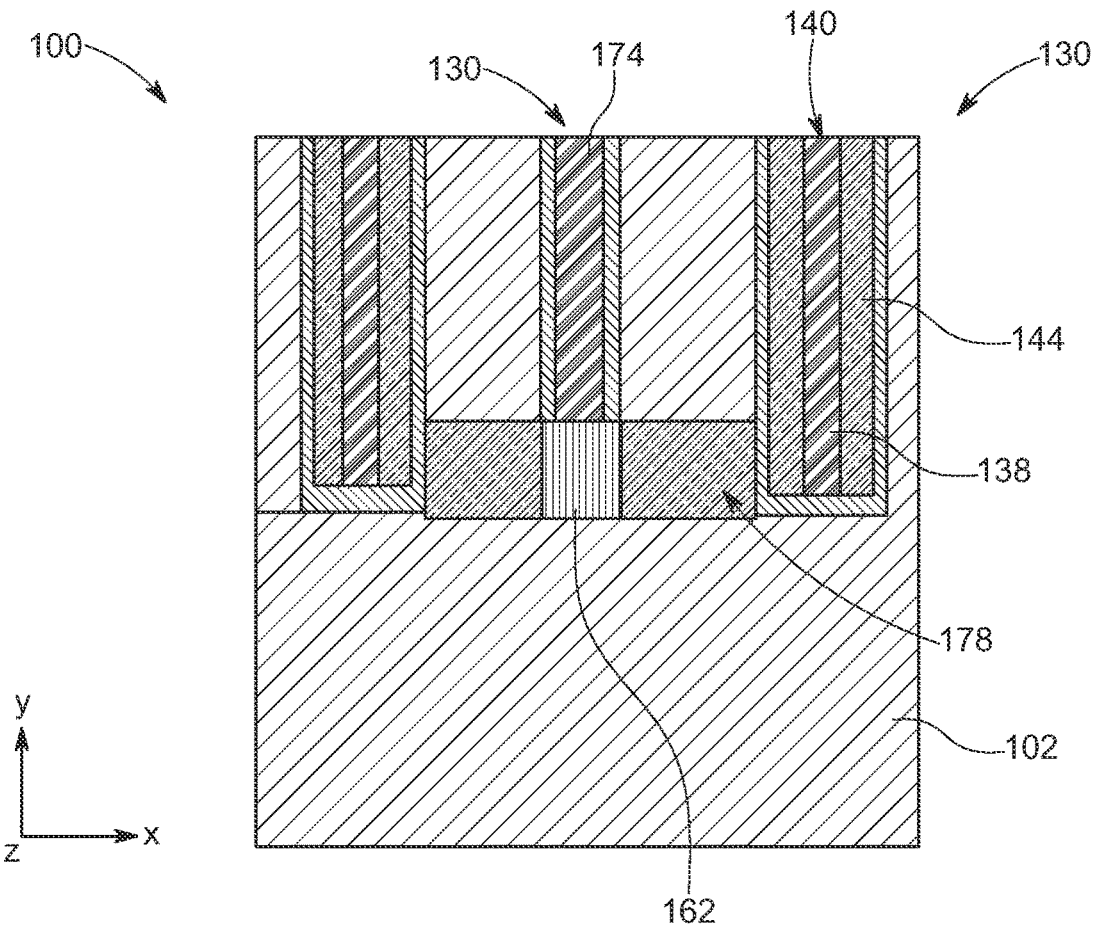
FIGS. 9A-9B illustrate cross-sectional side views of the device following deposition of an oxide, according to embodiments of the present disclosure.
Figure 9B:
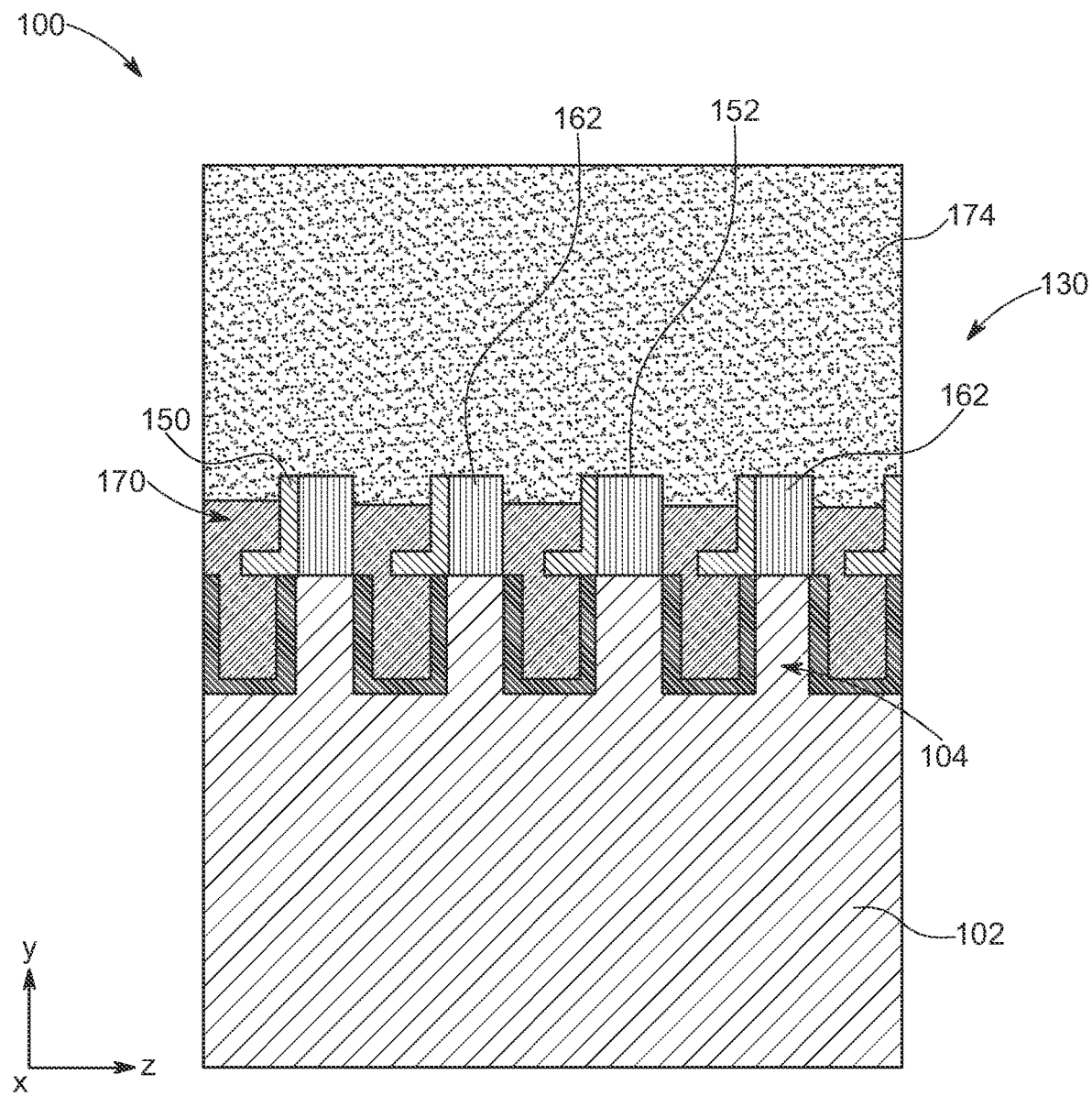

Next, as shown in FIGS. 9A-9B, an oxide 174 may be formed over the fill material 170. As shown, the oxide 174 may be deposited within the saddle area 130, directly atop the N+ bottom source/drain 162. As shown in FIG. 9A, the device 100 may further include diffused bottom junctions 178 formed as a result of the ion implant and annealing discussed above with reference to FIG. 5. The diffused bottom junctions 178 may directly abut the N+ bottom source/drain 162.

Figure 10:
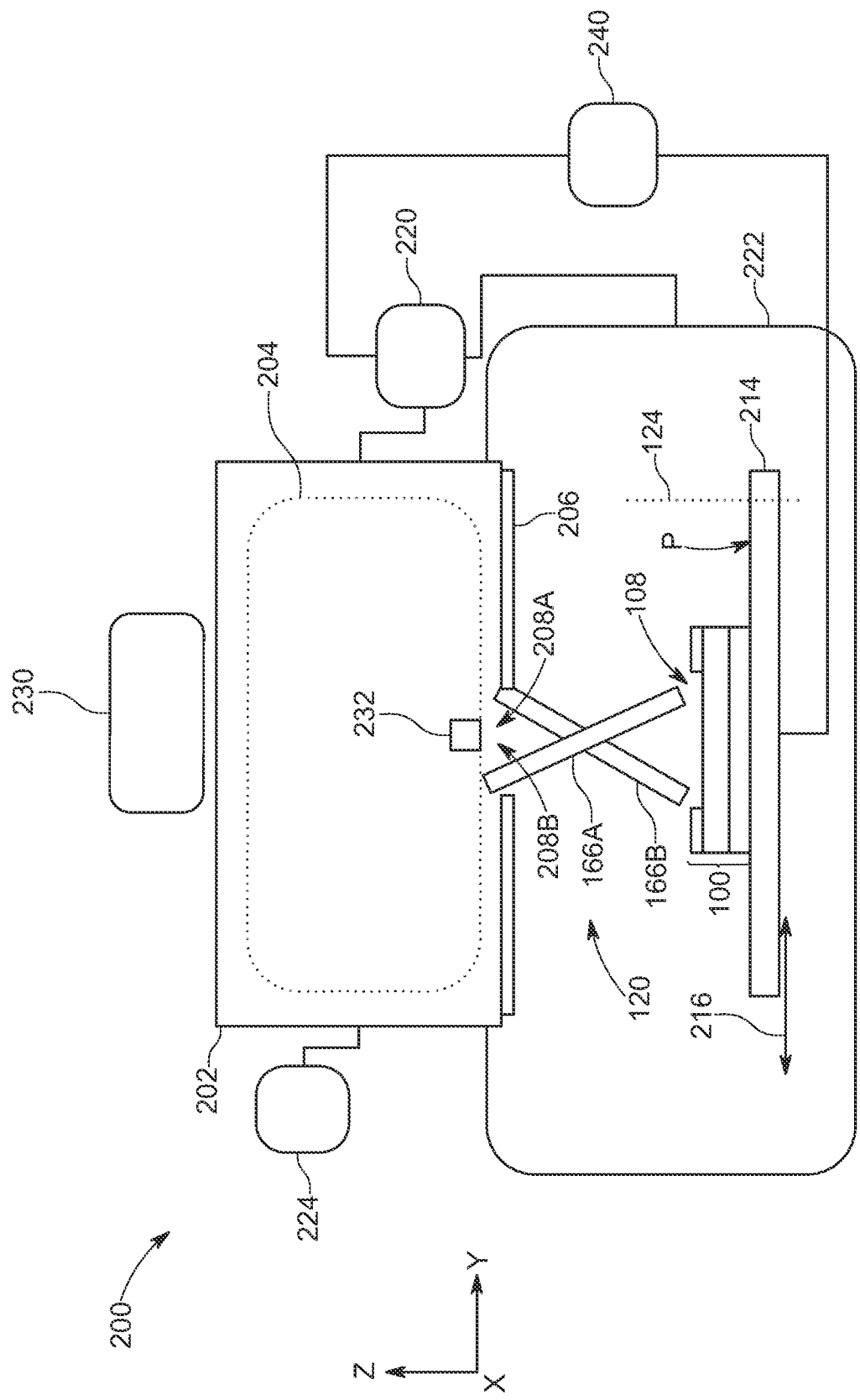
FIG. 10 illustrates a diagram of a processing apparatus according to embodiments of the present disclosure.

FIG. 10 depicts a side view of a processing apparatus 200 during ion beam processing of a substrate, in accordance with embodiments of the present disclosure. As to the general features of the processing apparatus 200, this apparatus represents a processing apparatus for selectively etching one or more layers of a device, such as selectively removing portions of the dielectric film 150 from the vertical structures 104 of the device 100, as described above. The processing apparatus 200 may be a plasma-based processing system having a plasma chamber 202 for generating a plasma 204 therein by any convenient method as known in the art. A power supply 230, may, for example, be an RF power supply to generate the plasma 204. An extraction plate 206 may be provided as shown, having an extraction aperture 208, where a selective etching may be performed to selectively remove sidewall layers. A substrate, such as substrate 102 having the aforementioned structure described above, is disposed in the process chamber 222.

A controller 240 may be provided to send control signals to the bias supply 220 and to a substrate stage 214. In one example, the view of FIG. 10 may represent a variant of the selective etching operation shown in FIG. 6, for example. During a directional etching operation, a plasma, such as a reactive plasma is formed using a reactive chemistry in the plasma chamber 202, and one or more angled ion beams 166A, 166B are extracted as a pair of ion beams, as shown. Although non-limiting, the processing apparatus 200 may include a beam blocker 232 disposed adjacent the extraction aperture 208. The beam blocker 232 is sized and positioned to define a first aperture 208A and a second aperture 208B, where the first aperture 208A forms the first angled ion beam 166A, and the second aperture 208B forms the second angled ion beam 166B. The two angled ion beams may define angles of incidence with respect to a perpendicular, equal in magnitude, opposite in direction. In one embodiment, the first angled ion beam 166A and the second angled ion beam 166B may represent an angled reactive ion beam. The beam blocker offset along the Z-axis with respect to extraction plate 206 may help define the angle of the angled ion beams.

In particular, as shown in FIG. 10, and with reference to the device 100 shown in FIG. 6, the angled ion beams 166A-166B, each forming a non-zero angle of incidence with respect to the Z-axis (normal to the substrate plane), may strike the device 100. As such, the first angled ion beam 166A and the second angled ion beam 166B may selectively etch the dielectric film 150 to remove the dielectric film 150 from the upper surface and from one side of each of the vertical structures 104

In this example, the angled ion beams 166A, 166B may be provided as a pair of ribbon ion beams that are formed by an elongated extraction aperture, extending to a beam width along the X-direction, where the beam width is adequate to expose an entire width of the device 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

The angled ion beams 166A, 166B may be extracted when a voltage difference is applied using a bias voltage source, shown as bias supply 220, between the plasma chamber 202 and device 100 as in known systems. The bias supply 220 may be coupled to the process chamber 222, for example, where the process chamber 222 and device 100 are held at the same potential. In various embodiments, the angled ion beams 166A, 166B may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another. When configured in the shape of a ribbon beam, these angled ion beams may expose an entirety of the device 100 to reactive ion etching of the trenches distributed in devices across the substrate, by scanning the substrate stage 214 along the scan direction 216, as shown.

In various embodiments, the value of the non-zero angle of incidence may vary from 5 degrees to 85 degrees, while in some embodiments the value may range between 15 degrees and 60 degrees. The embodiments are not limited in this context. The angled ion beams 166A, 166B may be composed of any convenient gas mixture, including inert gas, reactive gas, and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beams 166A, 166B and other reactive species may be provided as a predetermined etch recipe to the device 100 so as to perform a directed reactive ion etching of targeted sidewalls of patterning layers on device 100. The etch recipe may be selective with respect to the material of the vertical structures 104, so as to remove material of the spacer layer 112, while not etching the vertical structures 104, or etching the vertical structures 104 to a lesser extent.

In other embodiments, the processing apparatus 200 may be an ion assisted directional plasma treatment (PME) system operable to selectively treat and then remove portions of the dielectric film 150 by performing an angled etch process. Other apparatuses, such as pattern beams, electron beams (e.g., pulsed or continuous), raster scanning, variable scanning apparatus, etc., may be used in alternative embodiments. Any other method of directionally implanting ions may also be used.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a dynamic random-access memory transistor, the method comprising:
    forming a plurality of bitlines between a plurality of vertical structures extending from a substrate;
    forming a saddle area through the plurality of vertical structures and through the plurality of bitlines, wherein the saddle area comprises an oxide formed within a saddle trench;
    forming a dielectric film over each of the plurality of vertical structures of the saddle area;
    implanting, through the dielectric films, the plurality of vertical structures of the saddle area to form a bottom source/drain in each of the plurality of vertical structures of the saddle area; and
    removing the dielectric film from an upper surface of the plurality of bitlines and from just a first side of each vertical structure of the plurality of vertical structures of the saddle area.

2. The method of claim 1, further comprising forming a fill material over the plurality of vertical structures of the saddle area, wherein the fill material contacts the upper surface of the plurality of bitlines.

3. The method of claim 2, wherein the fill material is a metal or a doped polysilicon.

4. The method of claim 2, further comprising depositing an oxide over the fill material.

5. The method of claim 1, further comprising:
    forming a set of pillar trenches on opposite sides of the saddle area; and
    forming an oxide within the set of pillar trenches.

6. The method of claim 1, wherein removing the dielectric film comprises performing an angled ion etch oriented at a non-zero angle relative to a perpendicular extending from an upper surface of the plurality of vertical structures, wherein ions of the angled ion etch are directed into the first side and the upper surface of the plurality of vertical structures of the saddle area without being directed into a second side of the plurality of vertical structures of the saddle area.

7. The method of claim 1, wherein removing the dielectric film comprises:

performing an angled ion implant to modify an etch rate of the dielectric film, wherein ions of the angled ion implant are delivered at a non-zero angle relative to a perpendicular extending from an upper surface of the plurality of vertical structures, and wherein the ions of the angled ion implant are directed into the dielectric film along the first side and the upper surface of the plurality of vertical structures of the saddle area without being directed into the dielectric film along a second side of the plurality of vertical structures of the saddle area; and etching the dielectric film to remove the dielectric film from the first side and from the upper surface of the plurality of vertical structures of the saddle area.

8. The method of claim 1, wherein etching the dielectric film to remove the dielectric film from the first side and from the upper surface of the plurality of vertical structures of the saddle area comprises performing a wet etch or performing a dry etch.

9. The method of claim 1, wherein forming the plurality of bitlines comprises:

forming a nitride liner between each of the plurality of vertical structures, wherein the nitride liner extends only partially up a first side and a second side of the plurality of vertical structures of the saddle area;

forming a metal over the nitride liner; and forming a dielectric cap over the nitride liner and the metal.

* * * * *